(12) United States Patent
Lee

(10) Patent No.: US 6,184,071 B1
(45) Date of Patent: Feb. 6, 2001

(54) SEMICONDUCTOR DEVICE AND METHOD FOR FABRICATING THE SAME

(75) Inventor: Seung Ho Lee, Chungcheongbuk-do (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/435,361

(22) Filed: Nov. 8, 1999

(30) Foreign Application Priority Data

Jan. 20, 1999 (KR) .................................................. 99/1679

(51) Int. Cl.[7] .................................................. H01L 21/336
(52) U.S. Cl. ..................... 438/197; 438/221; 438/142; 438/233; 438/523; 438/584; 438/624
(58) Field of Search .................................. 438/197, 221, 438/233, 142, 523, 584, 624

(56) References Cited

U.S. PATENT DOCUMENTS

| | | | | |
|---|---|---|---|---|
| 5,706,164 | * | 1/1998 | Jeng ..................................... | 361/321 |
| 5,801,083 | * | 9/1998 | Yu et al. .............................. | 438/424 |
| 5,899,742 | * | 5/1999 | Sun ..................................... | 438/682 |
| 5,970,329 | * | 10/1999 | Cha ..................................... | 438/197 |
| 5,981,364 | * | 11/1999 | Ramsbey et al. .................... | 438/592 |
| 6,001,685 | * | 12/1999 | Kim .................................... | 438/253 |
| 6,008,513 | * | 12/1999 | Chen ................................... | 257/296 |
| 6,015,746 | * | 1/2000 | Yeh et al. ............................ | 438/421 |
| 6,027,975 | * | 2/2000 | Hergenrother et al. ............. | 438/268 |
| 6,033,962 | * | 3/2000 | Jeng et al. ........................... | 438/301 |

* cited by examiner

Primary Examiner—Matthew Smith
Assistant Examiner—Granvill D Lee

(57) ABSTRACT

Semiconductor device and method for fabricating the same, which can improve an isolation characteristic and prevent a leakage current in conducting a borderless process, the device including a semiconductor substrate having an active region and a field region defined thereon, a bilayered gate electrode formed in one direction on the active region, a trench formed in the field region, an isolation region formed in, and on the trench to form a step to the semiconductor substrate so as to be projected from the semiconductor substrate, an insulating film barrier formed along a boundary of the active region projected from the semiconductor substrate, impurity regions in the semiconductor substrate in the active region on both sides of the gate line, a planar protection film having contact holes to the impurity regions on both sides of the active region, and a contact plug formed in each of the contact holes.

16 Claims, 14 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device which can improve an isolation characteristic and prevent a leakage current in conducting a borderless process, and a method for fabricating the same.

2. Background of the Related Art

A related art method for fabricating a semiconductor device will be explained with reference to the attached drawings. FIGS. 1A~1G illustrate sections showing the steps of a related art method for fabricating a semiconductor device.

Referring to FIG. 1A, the related art method for fabricating a semiconductor device starts with depositing an initial oxide film 2 and a nitride film 3 on a semiconductor substrate 1 having an active region and a field region defined thereon. As shown in FIG. 1B, the nitride film is subjected to selective patterning to expose the initial oxide film 2 in the field region.

Then the patterned nitride film 3 is used as a mask to etch the semiconductor substrate 1 to form trenches therein. The trenches may be formed by coating a photoresist film on an entire surface, patterning the photoresist film to expose the field region, and etching the semiconductor substrate 1. Then, a first oxide film 4 is deposited in the trenches by thermal oxidization. A buried insulating film is then deposited on an entire surface and etched by chemical mechanical polishing or etch back, to planarize the buried insulating film and the nitride film 3, thereby forming a trench isolation region 5 projected from an upper plane of the semiconductor substrate, as shown in FIG. 1C.

Then, as shown in FIG. 1D, the nitride film 3 and the initial oxide film 2 on the active region are removed.

As shown in FIG. 1E, a gate oxide film 6 is formed on the exposed active region, and a polysilicon layer 7 is deposited on an entire surface for forming a gate electrode. This can result in local recesses 13 at edges of a trench region caused by too much insulating film being removed by wet etching conducted before the gate oxide film is formed. This causes a gate-wraparound in which a recess portion at an edge in the active region is wrapped around by the gate electrode.

As shown in FIG. 1F, a mask for forming a gate is used in patterning the polysilicon layer 7 and the gate oxide film 6, to form a stack of a gate electrode 8 and a gate oxide film 6. The semiconductor substrate 1 on both sides of the gate electrode 8 is lightly doped with impurity ions. Then, an oxide film or a nitride film is deposited on an entire surface and etched back, to form sidewall spacers 9 at sides of the gate electrode 8 and the gate oxide film 6. Then the semiconductor substrate 1 on opposite sides of the sidewall spacers 9, excluding a portion under the gate electrode 8, is heavily with impurity ions, to form LDD source/drain regions 10.

Then, as shown in FIG. 1G, a planar protection film 11 is deposited on an entire surface. Then a contact hole is formed to each of the source/drain regions 10, and a contact plug 12 is formed in each of the contact holes. In FIG. 1G, if the contact holes are misaligned so that the trench isolation region 5 is reached in addition to reaching the source/drain region 10. Then the problem arises that the contact plug 12 will also make in contact with the semiconductor substrate 1 at an interface of the active region and the field region.

The aforementioned related art method for fabricating a semiconductor device has the following problems.

First, the thin gate oxide film, formed at recess portion 13, shortens a device lifetime because the gate oxide film is susceptible to loss.

Second, as a thickness of the gate oxide film in a recess region becomes thinner due to loss of an edge portion in a trench isolation region, the device becomes more likely to degrade due to an inverse narrow width effect in which a threshold voltage decreases as a width of the gate is reduced.

Third, a short between the contact plug and the semiconductor substrate occurs when the contact hole is misaligned to reach to the field region, which causes a leakage current.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which can improve a device isolation and a contact characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate having an active region and a field region defined thereon, a bilayered gate electrode formed in one direction on the active region, a trench formed in the field region, an isolation region formed in, and on the trench to form a step to the semiconductor substrate so as to be projected from the semiconductor substrate, an insulating film barrier formed along a boundary of the active region projected from the semiconductor substrate, impurity regions in the semiconductor substrate in the active region on both sides of the gate line, a planar protection film having contact holes to the impurity regions on both sides of the active region, and a contact plug formed in each of the contact holes.

In another aspect of the invention, as embodied and broadly described herein, a semiconductor trench structure comprises a substrate being divided into active and field regions where a trench is formed in the field region, a surface film formed along a surface of the trench, and a barrier structure formed over edges of the trench.

In other aspect of the present invention, there is provided a method for fabricating a semiconductor device, comprising the steps of (1) defining an active region and a field region on a semiconductor substrate, (2) depositing a first insulating film on the semiconductor substrate, and forming a second insulating film pattern on the field region, (3) forming sidewall spacers at sides of the second insulating film pattern, (4) removing the first insulating film to expose the semiconductor substrate in the active region, and forming a gate insulating film, (5) forming a planar first conduction layer on the active region to a height identical to the second insulating film pattern, (6) forming a third insulating film on the first conduction layer on the active region, (7)

removing the first insulating film and the second insulating film on the field region, (8) forming a trench in the field region, (9) forming a fourth insulating film in the trench, (10) forming a buried insulating film on an entire surface of a resultant body, (11) planarizing the buried insulating film, the fourth insulating film, the first conduction layer and the sidewall spacers, to leave the first conduction layer on the active region and the sidewall spacers at a boundary of the active region and the field region, and for the buried insulating film on the trench to form a step to the semiconductor substrate, (12) forming a second conduction layer on an entire surface, and etching the first conduction layer and the second conduction layer to form the gate electrode on the active region, (13) forming impurity regions in the active region on both sides of the gate electrode, (14) forming a planar protection film to have contact holes to the impurity regions, and (15) forming a contact plug in each of the contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

As devices become highly integrated, particularly for fabrication of a logic device or SRAM, ways to increase contact alignment tolerance have been explored. One way is to make an active region larger in an area in which a contact is to be made, where the active region is formed in a straight line with a fixed height. However, this method does not allow high density integration of the devices. A borderless contact process can be used, which allows high density integration of devices and prevention of leakage current coming from misalignment.

Figure 1A:
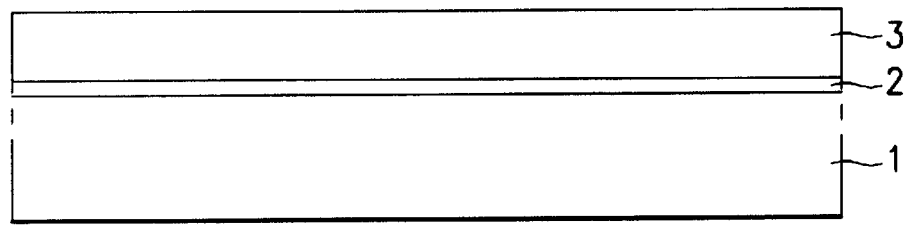
FIGS. 1A~1G illustrate sections showing the steps of a related art method for fabricating a semiconductor device.
Figure 1B:
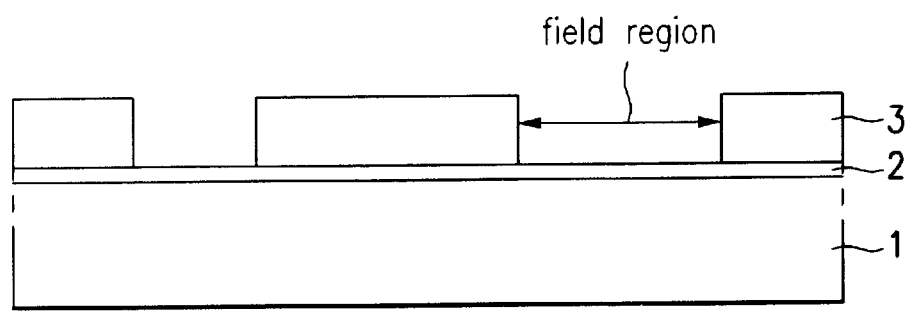
Figure 1C:
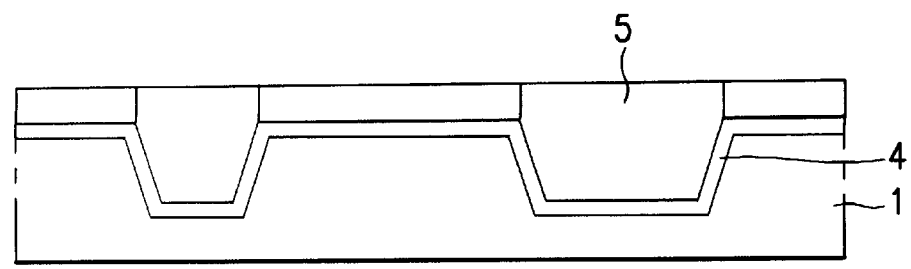
Figure 1D:
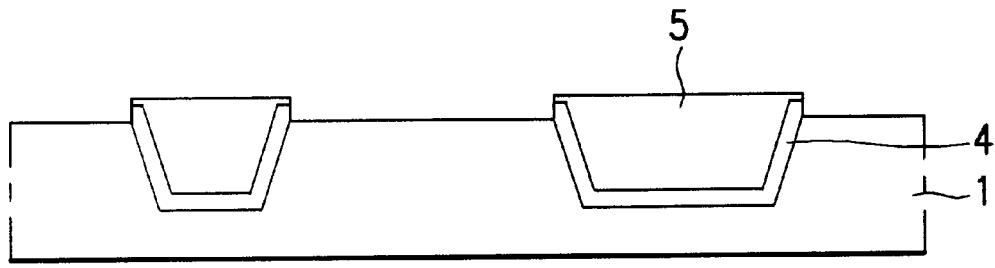
Figure 1E:
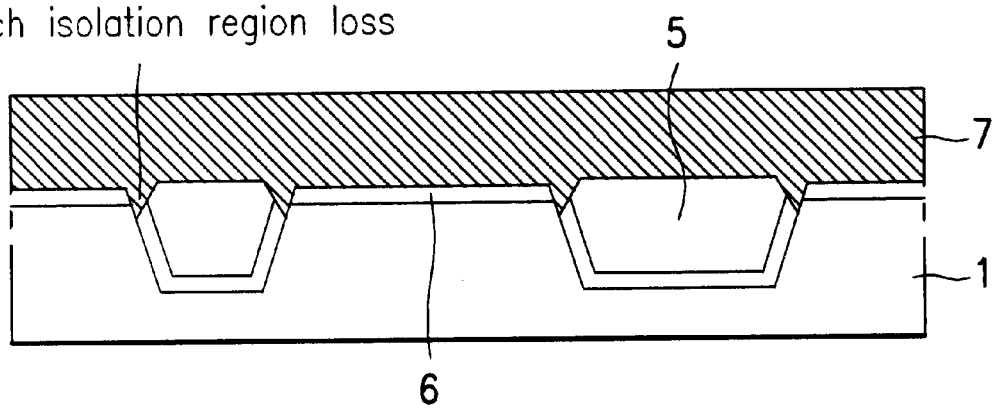
Figure 1F:
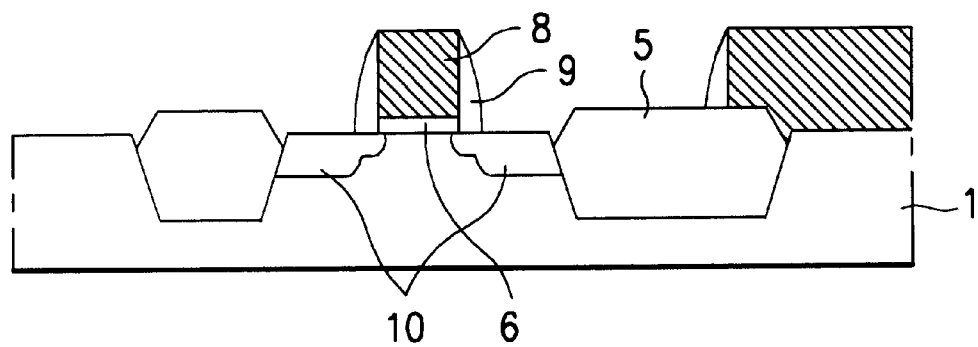
Figure 1G:
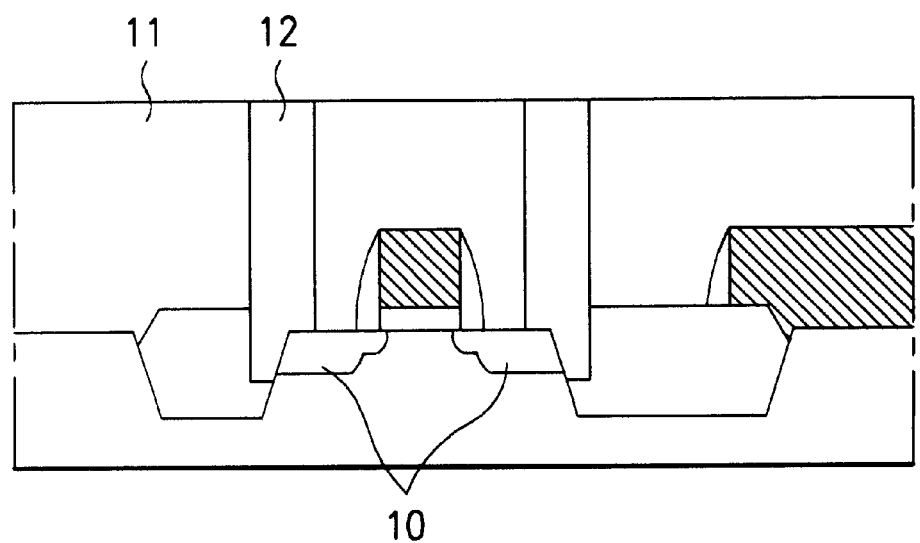
Figure 2A:
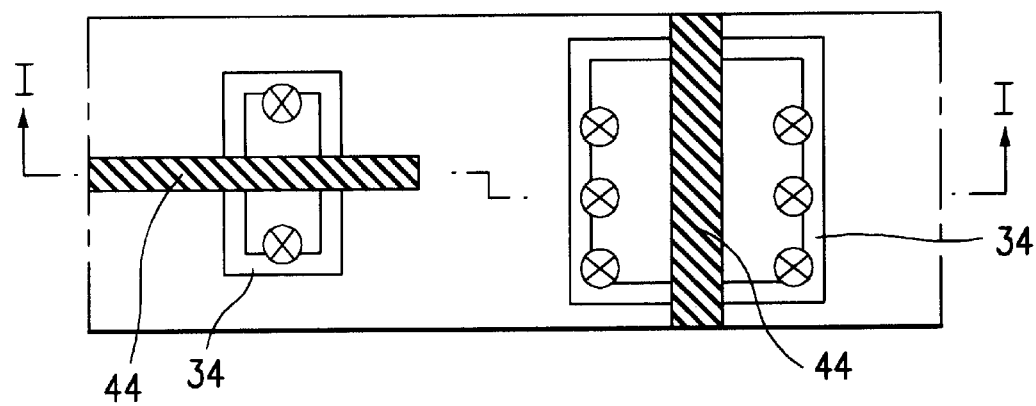
FIG. 2A illustrates a plan view of a semiconductor device in accordance with a first/preferred embodiment of the present invention.

The present invention utilizes the borderless contact process, and the semiconductor device and the method for fabricating the same of the present invention will be explained with reference to the attached drawings. At first, the semiconductor device of the present invention will be explained. FIG. 2A illustrates a plan view of a semiconductor device in accordance with a first preferred embodiment of the present invention, FIG. 2B illustrates a section across line I—I in FIG. 2A, FIG. 3A illustrates a plan view of a semiconductor device in accordance with a second preferred embodiment of the present invention, and FIG. 3B illustrates a section across line II—II in FIG. 3A.

Figure 2B:
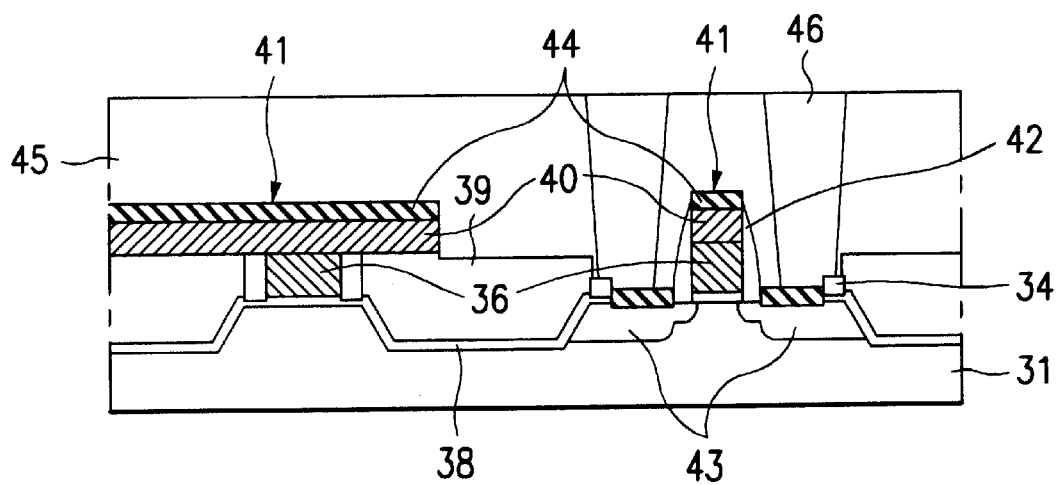
FIG. 2B illustrates a section across line I—I in FIG. 2A.
Figure 3A:
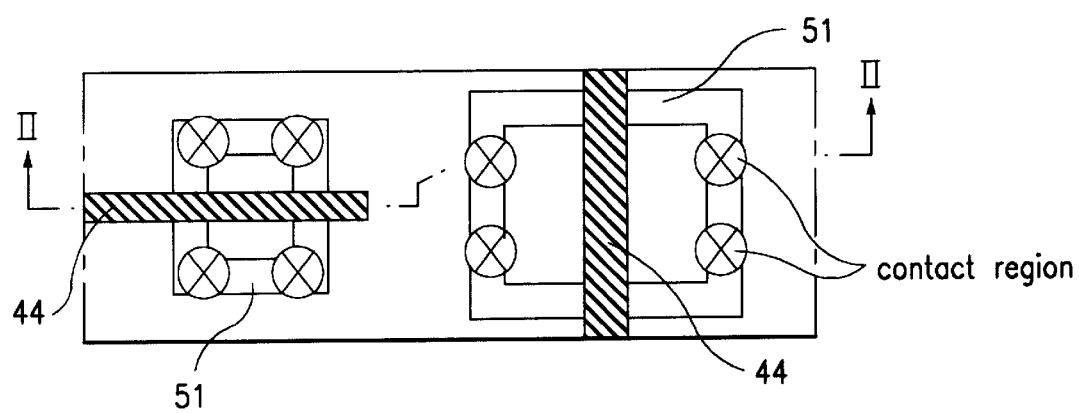
FIG. 3A illustrates a plan view of a semiconductor device in accordance with a second preferred embodiment of the present invention.
Figure 3B:
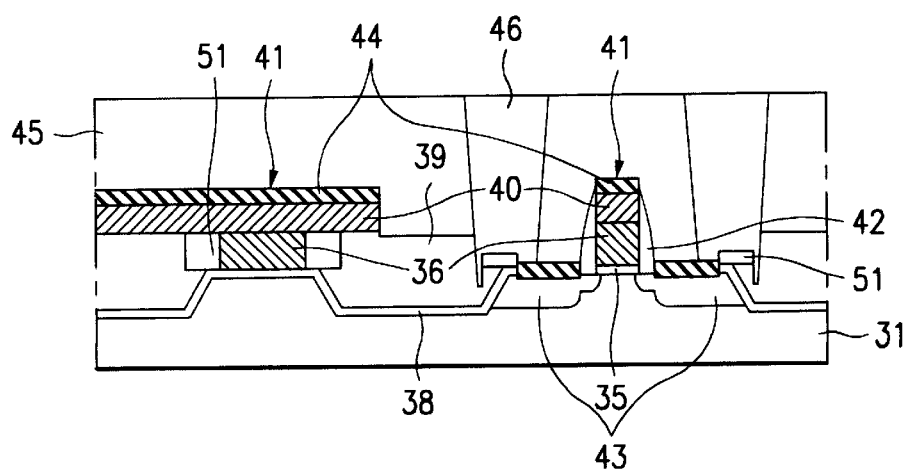
FIG. 3B illustrates a section across line II—II in FIG. 3A.

Referring to FIGS. 2A and 2B, the semiconductor device in accordance with a first preferred embodiment of the present invention includes a semiconductor substrate 31 having trenches formed in a field region and a thin third oxide film 38 formed along surfaces of the trenches. Nitride film spacers 34 are projected from the semiconductor substrate 31 along interfaces of the active region and the field region. A gate line 41 is formed on a central portion of the active region in one direction. The gate line 41 has a stack of a first polysilicon layer 36 patterned on the active region and a second polysilicon layer 40 in a form of a line (see FIG. 4J). A buried insulating film 39 is formed at the same height as the first polysilicon 36 layer patterned on the isolation region inclusive of the trench (see FIG. 4I).

In FIG. 2B, there are LDD source/drain regions 43 formed in the active region on both sides of the gate line 41, and a self-aligned silicide (salicide) layer 44 on top of the gate line 41 and on surfaces of the source/drain regions 43.

A planar protection film 45 having contact holes to the source/drain regions 43 is formed on an entire surface of a resultant body. Contact plugs 46 in the contact holes make contact with the source/drain regions 43.

The related art problem of the gate oxide film 38 being too thin at corners of the trench where the buried insulating film 39 in the trench in the field region assumes a step configuration next to the boundary with the active region because nitride film sidewall spacers 34 are formed along a periphery of the active region. Therefore, even if the contact hole is formed at the boundary of the active region, no degradation occurs to generate a leakage current. Thus, in the first embodiment of the present invention, the nitride film sidewall spacers 34 are formed along a boundary of the active region to compensate for thin spots in the insulating film 38 by acting as an additional barrier in formation of the contact holes.

In a second embodiment of the present invention, the nitride film barriers formed along boundary of the active region in the first embodiment are extended to the field region, which will be explained with reference to the drawings.

Referring to FIGS. 3A and 3B, the semiconductor device in accordance with the second preferred embodiment of the present invention includes nitride film barriers 51, formed at a boundary of the active region, that extend from the edge of the trench into the field region. Accordingly, leakage current to the semiconductor substrate 31 can be prevented even if the contact hole is misaligned to reach to the field region. Other structures of the second embodiment semiconductor device are the same with the first embodiment semiconductor device.

A method for forming the aforementioned semiconductor device of the present invention will be explained. FIGS. 4A~4L illustrate sections showing the steps of a method for fabricating a semiconductor device in accordance with a first preferred embodiment of the present invention, and FIGS. 5A~5F illustrate sections showing the steps of a method for fabricating a semiconductor device in accordance with a second preferred embodiment of the present invention.

Figure 4A:
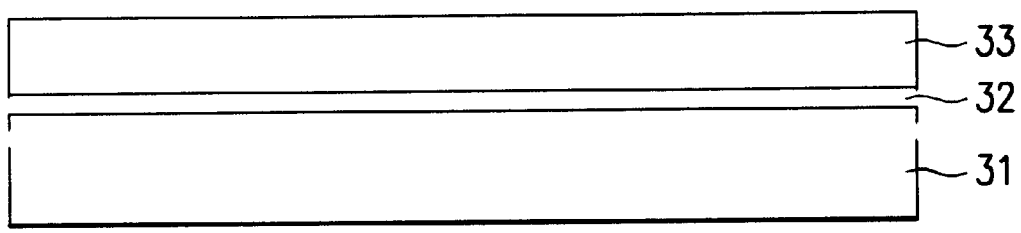
FIGS. 4A~4L illustrate sections showing the steps of a method for fabricating a semiconductor device in accordance with a first preferred embodiment of the present invention.

Referring to FIG. 4A, the method for fabricating a semiconductor device in accordance with a first preferred embodiment of the present invention starts by forming a first oxide film 32 on a semiconductor substrate 31 to a thickness of 100 A~200 A by chemical vapor deposition or thermal oxidization and depositing a first nitride film 33 on the first oxide film 32 to a thickness of 1000 A~2000 A.

Figure 4B:
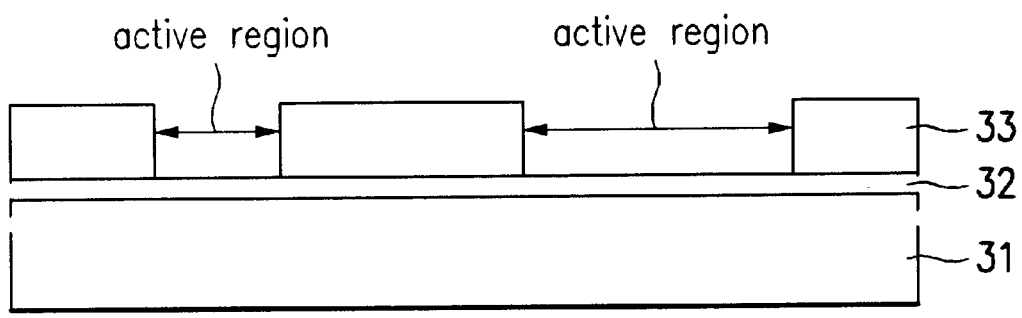

Then, as shown in FIG. 4B, a photoresist film(not shown) is coated on the first nitride film 33. After field and active regions are defined, the photoresist film is patterned, to expose the first nitride film 33 in the active region. Then, the patterned photoresist film is used as a mask in dry etching the first nitride film 33 until the first oxide film 32 in the active region is exposed.

Figure 4C:
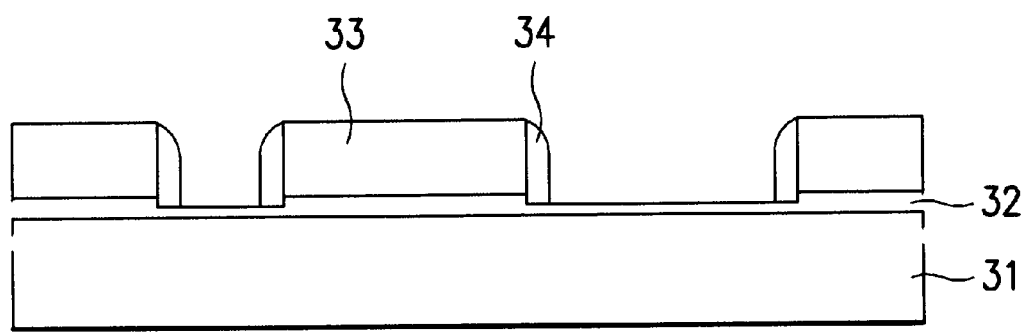

Next, as shown in FIG. 4C, a second nitride film is deposited by chemical vapor deposition, and the first oxide film 32 is etched back, to form nitride film sidewall spacers 34 to a thickness ranging 300 A~500 A.

Figure 4D:
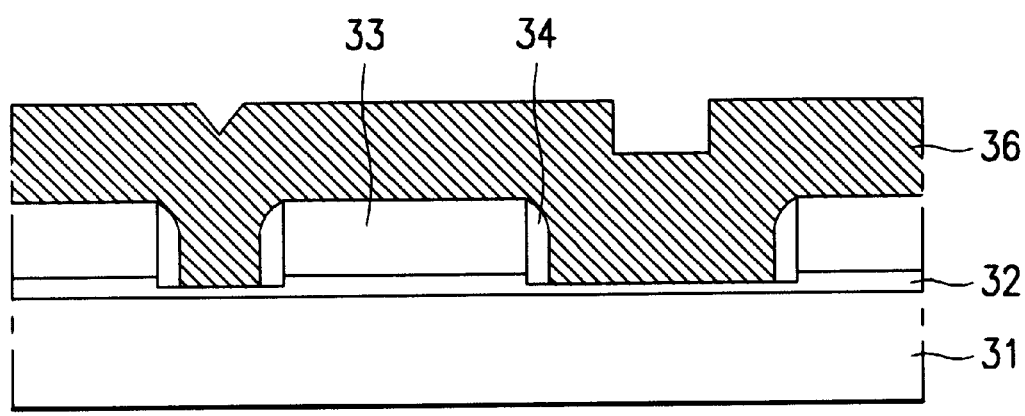

Then, as shown in FIG. 4D, the exposed first oxide film 32 is removed, a gate oxide film 35 is formed, and a first polysilicon layer 36 is deposited on an entire surface of a resultant body for forming a gate electrode.

Figure 4E:
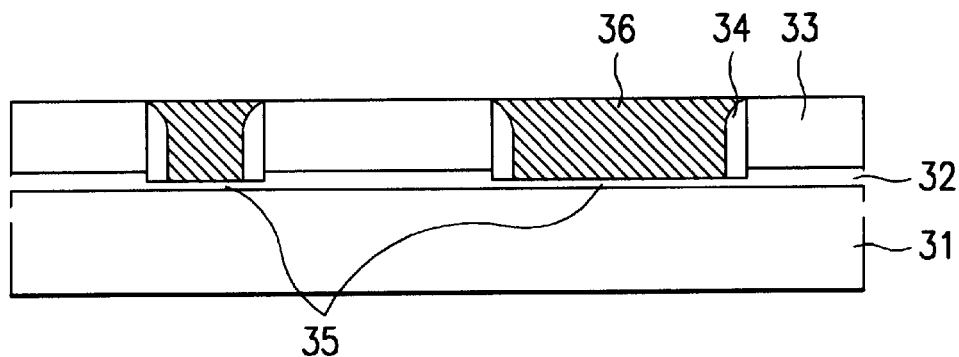

Then the first polysilicon layer 36 is planarized by chemical mechanical polishing or etch back, to leave the first polysilicon layer 36 only on the active region, as shown in FIG. 4E. The planarization removes enough material to expose the surface of the first nitride film 33.

Figure 4F:
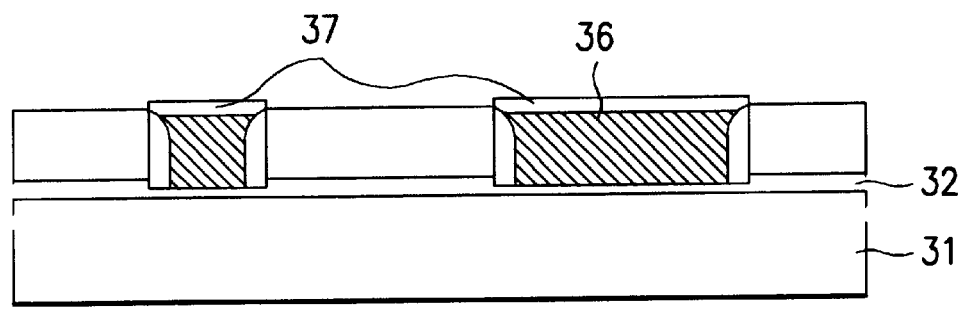

Then an exposed surface of the first polysilicon 36 is oxidized to form a second oxide film 37 to a thickness of 200 A~1000 A, as shown in FIG. 4F.

Figure 4G:
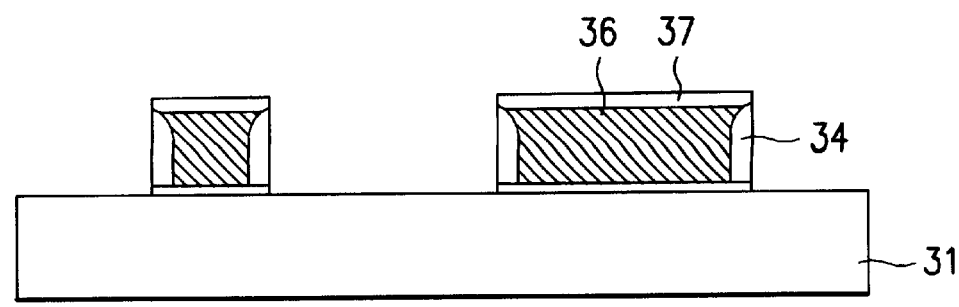

As shown in FIG. 4G, then the first nitride film 33 and the first oxide film 32 on the field region are dry etched to leave the nitride film sidewall spacers 34 at a boundary of the active region, and to expose the semiconductor substrate 31.

Figure 4H:
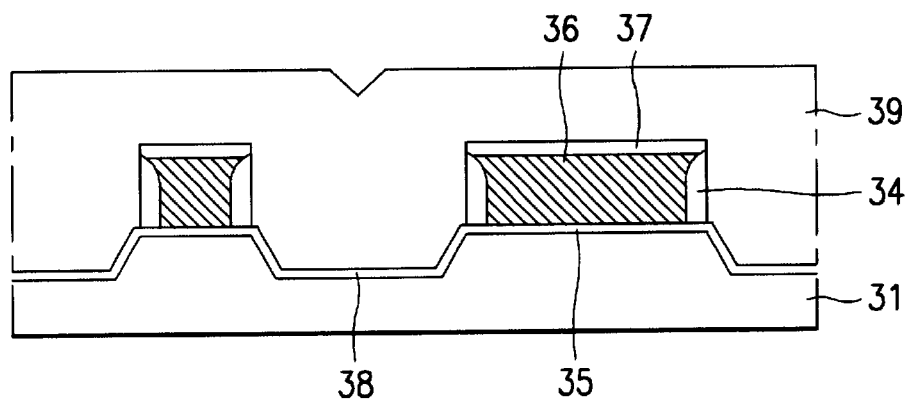

As shown in FIG. 4H, the semiconductor substrate 31 is etched to a depth of 2500 A~4000 A, using the second oxide film 37 as a mask, to form a trench. Then the substrate 31 is subjected to thermal oxidation to form a third oxide film 38 to a thickness of 50 A~200 A. A buried insulating film 39 is then deposited to fill in the trench.

Figure 4I:
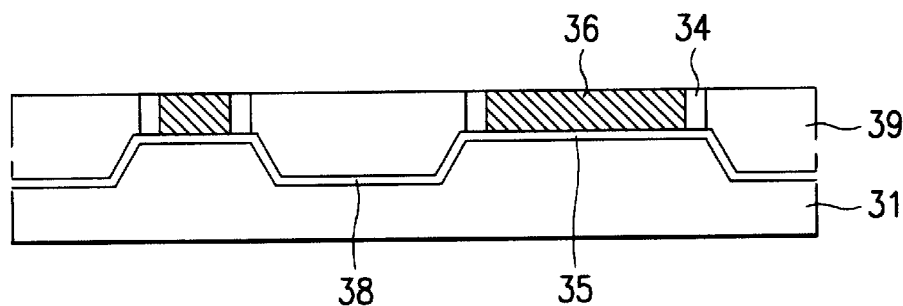

As shown in FIG. 4I, the buried insulating film 39, the second oxide film 37, the first polysilicon layer 36 and the nitride film sidewall spacers 34 are polished flat by chemical mechanical polishing.

Figure 4J:
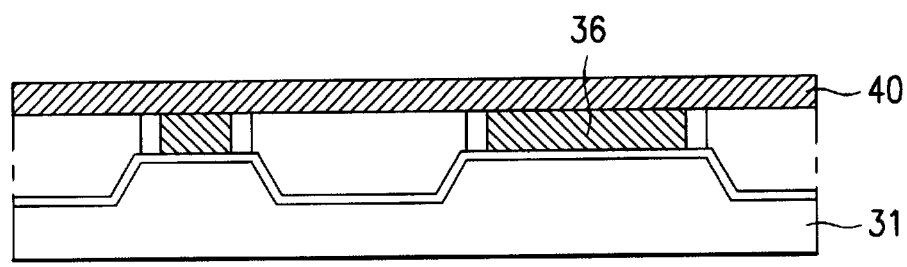

Then a second polysilicon layer 40 is deposited to a thickness of 500 A~1000 A on an entire surface of a resultant body as a material for forming a gate, as shown in FIG. 4J. A metal may be deposited instead of the second polysilicon layer 40.

Figure 4K:
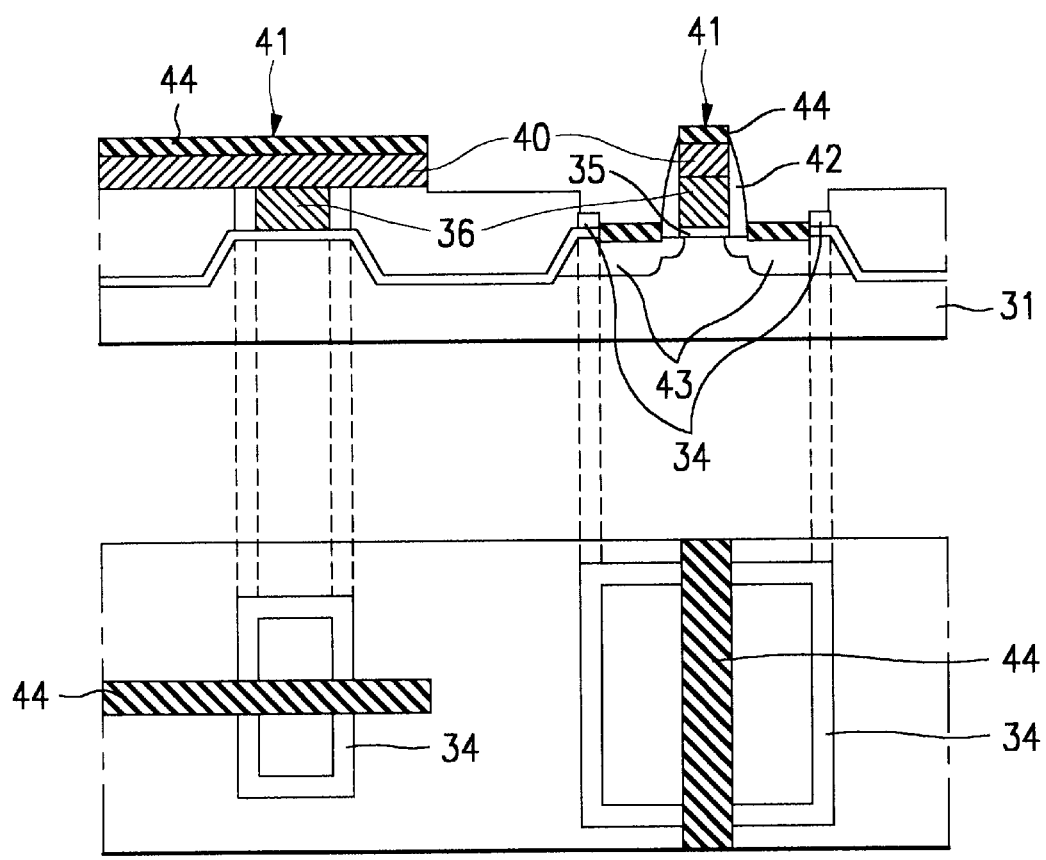

As shown in FIG. 4K, then a mask for forming a gate is used to subject the first and second polysilicon layers 36 and 40 and the gate oxide film 35 to anisotropic etching to form a gate line 41 to cross approximately at center of the active region. Then, after lightly doping the active region on both sides of the gate line 41 with impurity ions, an oxide film or a nitride film is deposited on an entire surface and etched back to form gate sidewall spacers 42 at both sides of the gate line 41. The active region, on opposite sides of the gate sidewall spacers 42, excluding a portion under the gate line 41, is heavily doped with impurity ions to form source/drain regions 43. The nitride film sidewall spacers 34 are projected along a periphery of the active region. Then, a metal layer is deposited on an entire surface and heat treated, to form a salicide layer 44 on a surface of the gate line 41.

Figure 4L:
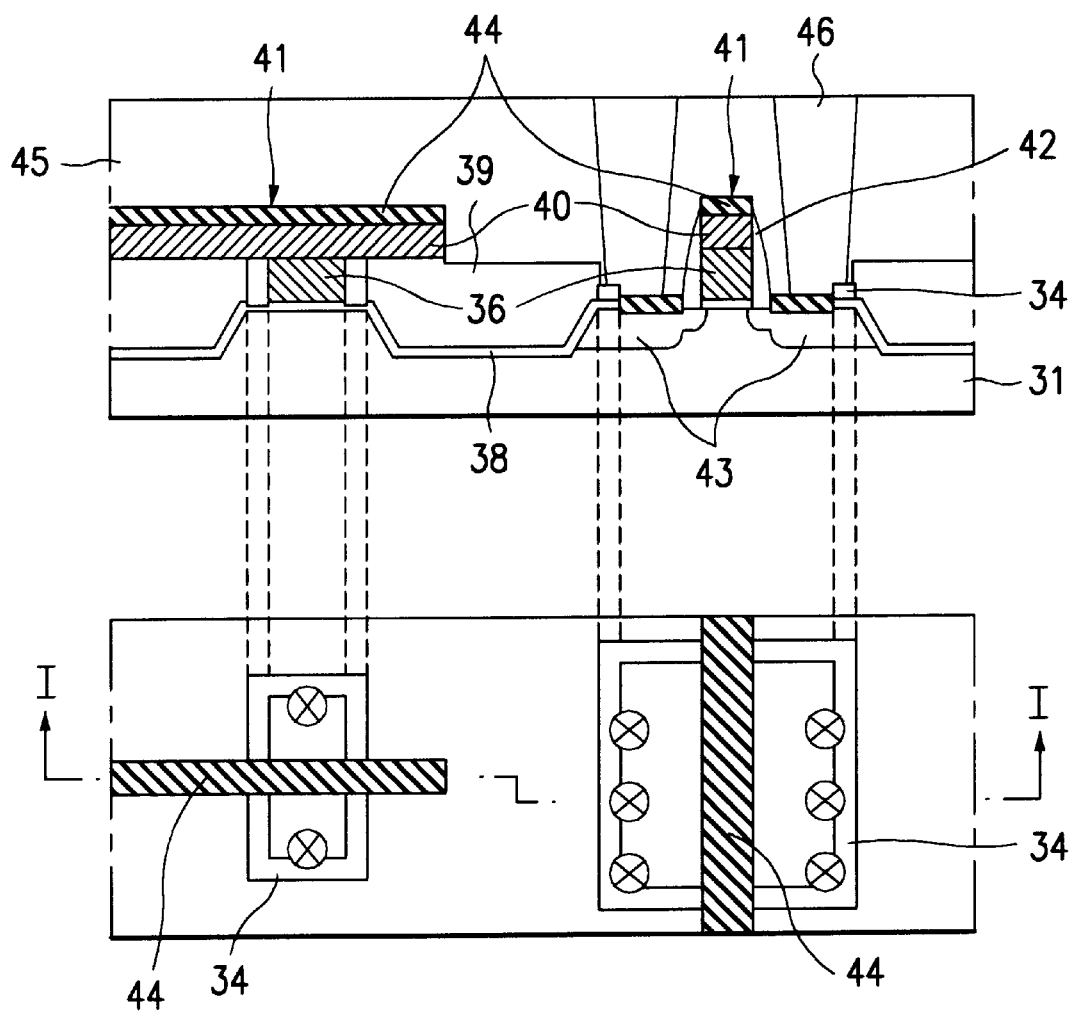

As shown in FIG. 4L, after forming a planar protection film 45 on an entire surface of a resultant body, contact holes are formed to expose the source/drain regions 43. And, contact plugs 46 are formed in the contact holes.

Figure 5A:
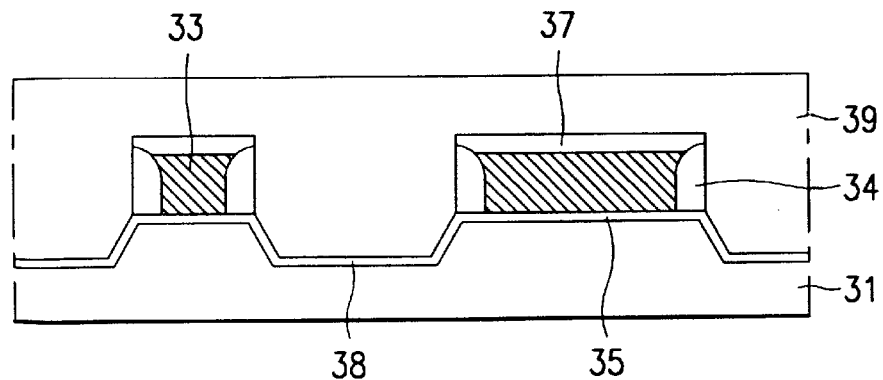
FIGS. 5A~5F illustrate sections showing the steps of a method for fabricating a semiconductor device in accordance with a second preferred embodiment of the present invention.

A method for fabricating a semiconductor device in accordance with a second preferred embodiment of the present invention will be explained. A method for forming a structure as shown in FIG. 5A is identical to a method according to FIGS. 4A~4H in the first embodiment of the present invention.

Figure 5B:
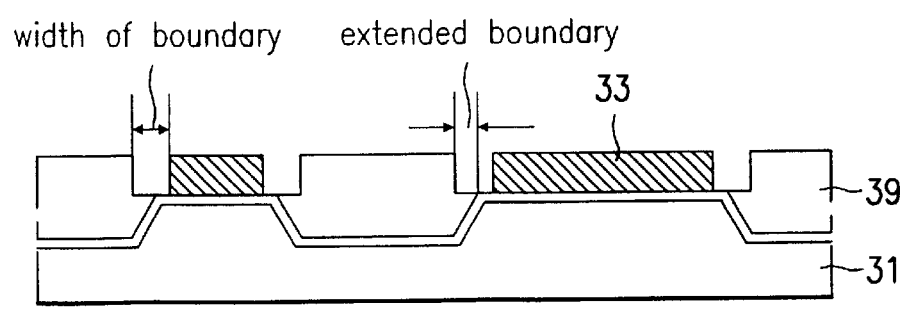

Thereafter, as shown in FIG. 5B, the buried insulating film 39, the second oxide film 37, the first nitride film 33, and the nitride film sidewall spacers 34 are etched flat by chemical mechanical polishing. The nitride film sidewall spacers 34 at a boundary of the active region are dry etched to form a groove. Then, the buried insulating film 39 at one side of the groove is wet etched to extend a width of the groove from the boundary of the active region to the field region. The width of the extended groove is in a range of 150 A~300 A.

Figure 5C:
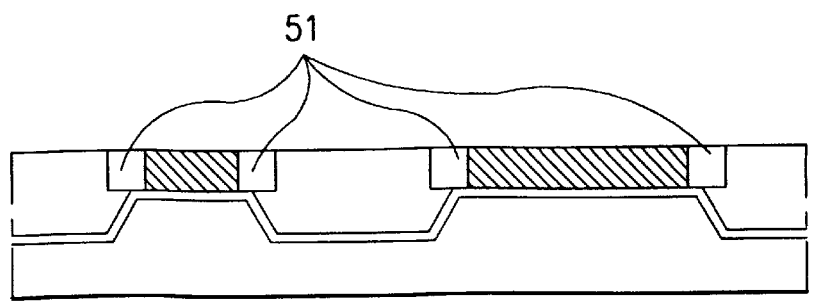

Next, as shown in FIG. 5C, a third nitride film is deposited on an entire surface of a resultant body. It is etched back to leave the third nitride film only in the groove so as to form a nitride film barrier 51.

Figure 5D:
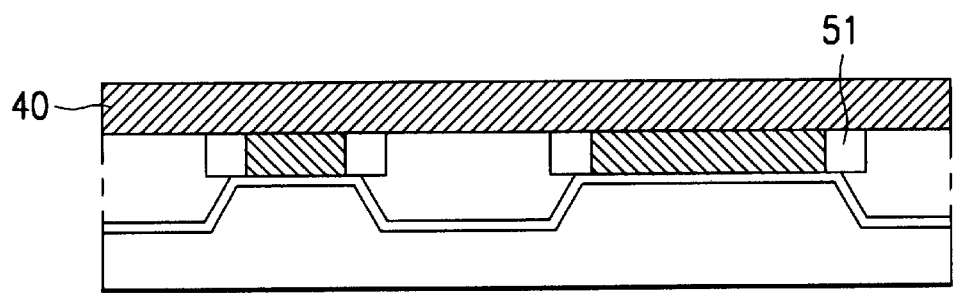

Then a second polysilicon layer 40 is deposited on an entire surface of a resultant body to a thickness of 500 A~1000 A as a material for forming a gate as shown in FIG. 5D.

Figure 5E:
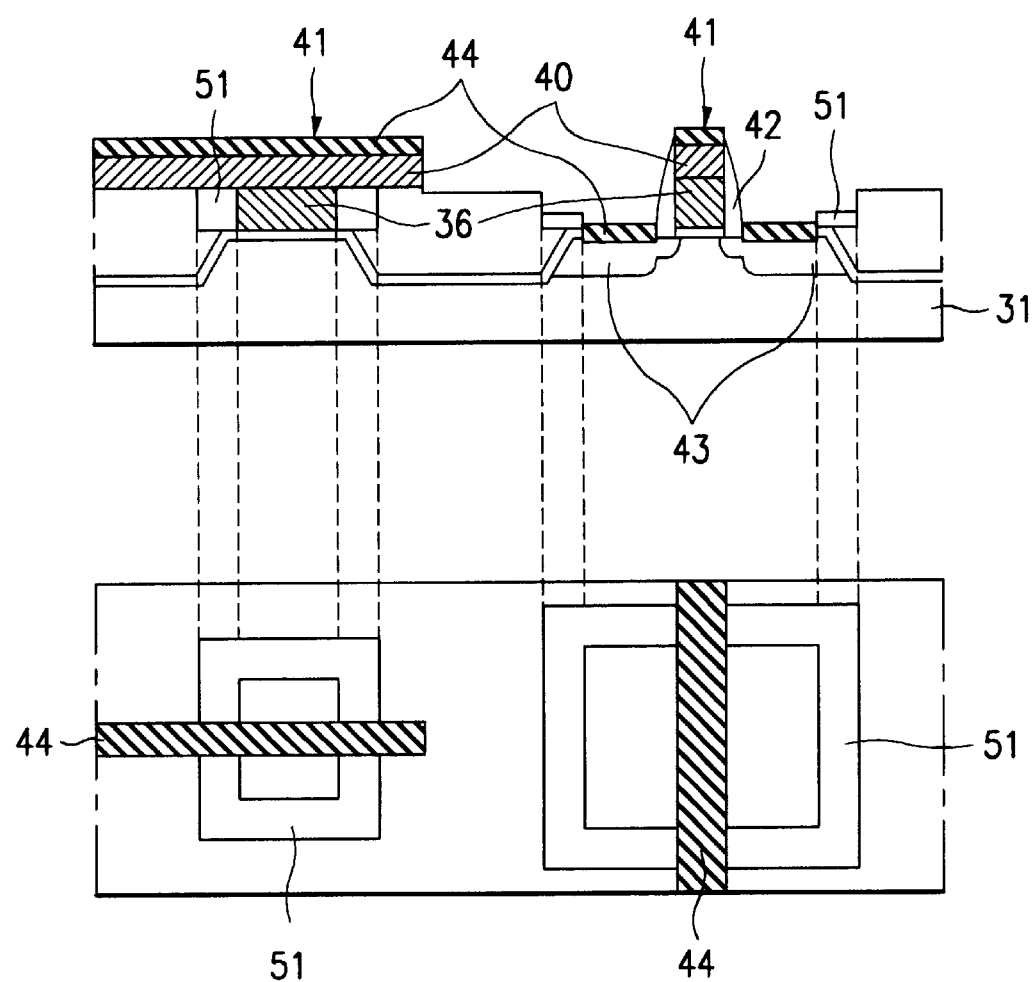

As shown in FIG. 5E, then the first and second polysilicon layers 36 and 40 and the gate oxide film 35 are subjected to anisotropic etching using a mask to form a gate line 41.

The gate line 41 crosses at approximately the center of the active region. The active region on both sides of the gate line 41 is lightly doped with impurity ions, and an oxide film or nitride film is deposited on an entire surface and etched back to form gate sidewall spacers 42 at both sides of the gate line 41. The active region on opposite sides of the gate sidewall spacers 42, excluding a portion under the gate line 41, is heavily doped with impurity ions, to form source/drain regions 43. The nitride film barrier 51 remains along a portion that extends to the field region from the boundary of the active region. Then, a metal layer is deposited on an entire surface and heat treated, to form a salicide layer 44 on a surface of the gate line 41.

Figure 5F:
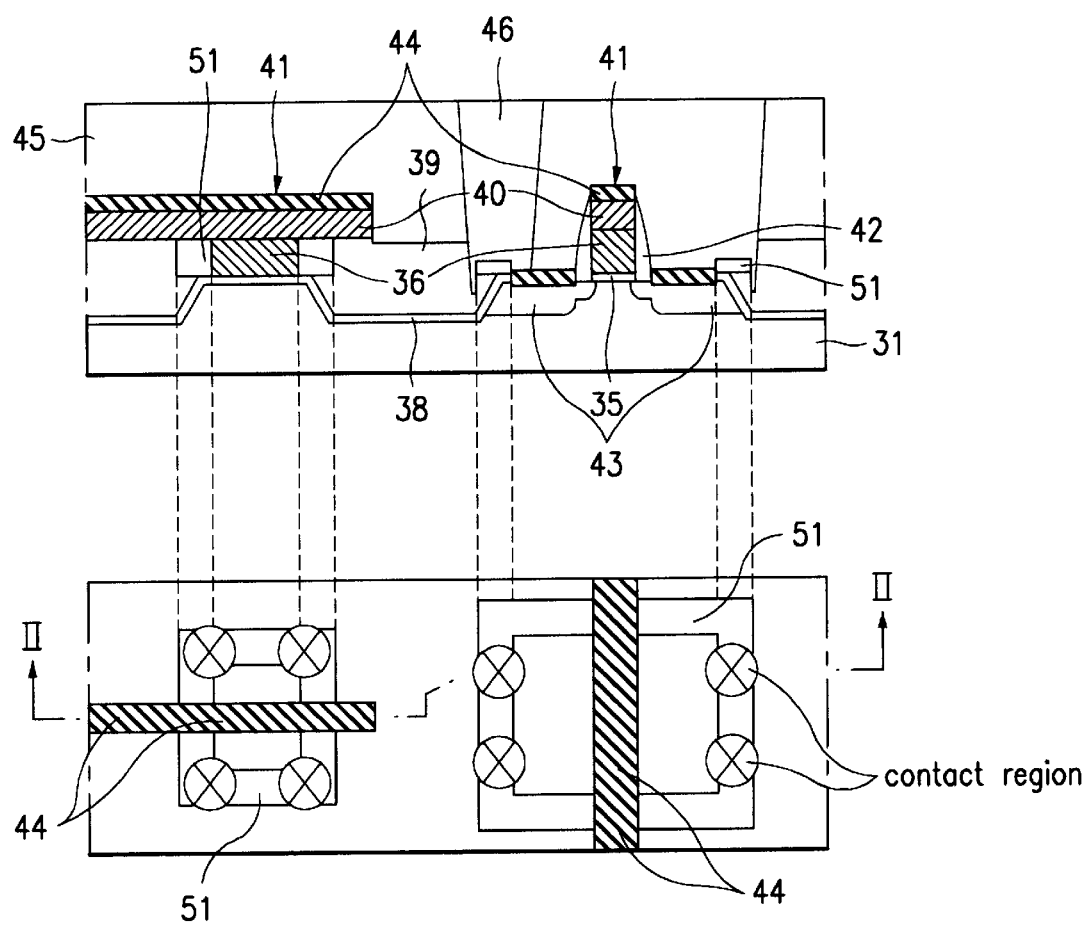

And, as shown in FIG. 5F, a planar protection film 45 is deposited on an entire surface of a resultant body, and contact holes are formed to expose the source/drain regions 43. Then, contact plugs 46 are formed in the contact holes. A result is that the contact plug 46 makes no short with the semiconductor substrate 31 even if the contact plug 46 is misaligned to reach to the field region.

The semiconductor device and the method for fabricating the same of the present invention has the following advantages.

First, the buried insulating film formed to have a step to the semiconductor substrate and the nitride film barrier formed at a boundary of the active region make electric field stronger at corners of the trench, which prevents device degradation.

Second, the buried insulating film and the nitride film barrier thus formed prevents device degradation caused by inverse narrow width effect.

Third, the nitride film barrier at a boundary of the active region prevents leakage current caused by a short between the contact plug and the semiconductor substrate.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:
    (1) defining an active region and a field region on a semiconductor substrate;
    (2) depositing a first insulating film on the semiconductor substrate, and forming a second insulating film pattern on the field region;
    (3) forming sidewall spacers at sides of the second insulating film pattern;
    (4) removing the first insulating film to expose the semiconductor substrate in the active region, and forming a gate insulating film;
    (5) forming a planar first conduction layer on the active region to a height identical to the second insulating film pattern;
    (6) forming a third insulating film on the first conduction layer on the active region;
    (7) removing the first insulating film and the second insulating film on the field region;
    (8) forming a trench in the field region;
    (9) forming a fourth insulating film in the trench;
    (10) forming a buried insulating film on an entire surface of a resultant body;
    (11) planarizing the buried insulating film, the fourth insulating film, the first conduction layer and the sidewall spacers, to leave the first conduction layer on the active region and the sidewall spacers at a boundary of the active region and the field region, and for the buried insulating film on the trench to form a step to the semiconductor substrate;
    (12) forming a second conduction layer on an entire surface, and etching the first conduction layer and the second conduction layer to form the gate electrode on the active region;
    (13) forming impurity regions in the active region on both sides of the gate electrode;
    (14) forming a planar protection film to have contact holes to the impurity regions; and,
    (15) forming a contact plug in each of the contact holes.

2. A method as claimed in claim 1, wherein the first, third and fourth insulating films are formed of oxide.

3. A method as claimed in claim 1, wherein the second insulating film pattern and the sidewall spacers are formed of nitride.

4. A method as claimed in claim 1, wherein the step (5) includes the steps of;
    depositing the first conduction layer on an entire surface, and
    etching by chemical mechanical polishing or etch back down to a surface of the second nitride film pattern.

5. A method as claimed in claim 1, wherein the trench is formed by etching the semiconductor substrate to a depth of 2500 A~4000 A using the third insulating film as a mask.

6. A method as claimed in claim 1, wherein the second conduction layer is formed of polysilicon or metal.

7. A method as claimed in claim 1, wherein the first insulating film has a thickness of 100 A~200 A and the second insulating film has a thickness of 1000 A~2000 A.

8. A method as claimed in claim 1, wherein the sidewall spacer has a thickness of 300 A~500 A.

9. A method as claimed in claim 1, wherein the third insulating film has a thickness of 200 A~1000 A.

10. A method as claimed in claim 1, wherein the fourth insulating film is formed by thermal oxidation to a thickness of 50 A~200 A.

11. A method as claimed in claim 1, wherein the second conduction layer has a thickness of 500 A~1000 A.

12. A method for fabricating a semiconductor device, comprising the steps of:
    (1) defining an active region and a field region on a semiconductor substrate;
    (2) depositing a first insulating film on the semiconductor substrate, and forming a second insulating film pattern on the field region;
    (3) forming sidewall spacers at sides of the second insulating film pattern;
    (4) removing the first insulating film to expose the semiconductor substrate in the active region, and forming a gate insulating film;
    (5) forming a planar first conduction layer on the active region to a height identical to the second insulating film pattern;
    (6) forming a third insulating film on the first conduction layer on the active region;
    (7) removing the first insulating film and the second insulating film on the field region;
    (8) forming a trench in the field region;
    (9) forming a fourth insulating film in the trench;
    (10) forming a buried insulating film on an entire surface of a resultant body;
    (11) planarizing to leave the buried insulating film, the first conduction layer and the sidewall spacers;
    (12) planarizing the buried insulating film, the fourth insulating film, the first conduction layer and the sidewall spacers to leave the first conduction layer on the active region and the sidewall spacers at a boundary of the active region and the field region, and for the buried insulating film on the trench to form a step to the semiconductor substrate;
    (13) removing the sidewall spacers at a periphery of the active region to form grooves, the grooves extending from the edge of the trench into the field region;
    (14) filling the grooves to form insulating film barriers;
    (15) forming a second conduction layer on an entire surface, and etching the first conduction layer and the second conduction layer to form the gate electrode on the active region;
    (16) forming impurity regions in the active region on both sides of the gate electrode;
    (17) forming a planar protection film to have contact holes to the impurity regions; and,
    (18) forming a contact plug in each of the contact holes.

13. A method as claimed in claim 12, wherein the second insulating film pattern, the sidewall spacers and the insulating film pattern are formed of nitride.

14. A method as claimed in claim 12, wherein each groove is extended into the field region by wet etching the buried insulating film.

15. A method as claimed in claim 12, wherein each insulating film barrier is extended into the field region by a width of 150 A~300 A.

16. A method of making a semiconductor device, comprising:
(a) dividing a substrate into active and field regions;
(b) forming barrier structures at interfaces between said active and field regions;
(c) forming trenches in said field regions of said substrate;
(d) forming a gate structure on a portion of said active region of said substrate;
(e) forming source and drain regions within said active region of said substrate aside said gate structure, respectively; and
(f) forming a protection film over, and having contact holes extending through to said source and drain regions and exposing said barrier structures and said source and drain regions, respectively.

* * * * *